United States Patent
Su et al.

(10) Patent No.: US 8,252,489 B2
(45) Date of Patent: Aug. 28, 2012

(54) MASK-SHIFT-AWARE RC EXTRACTION FOR DOUBLE PATTERNING DESIGN

(75) Inventors: Ke-Ying Su, Taipei (TW); Chung-Hsing Wang, Baoshan Township (TW); Jui-Feng Kuan, Zhubei (TW); Hsiao-Shu Chao, Baoshan Township (TW); Yi-Kan Cheng, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/167,905

(22) Filed: Jun. 24, 2011

(65) Prior Publication Data

US 2012/0054696 A1    Mar. 1, 2012

Related U.S. Application Data

(63) Continuation-in-part of application No. 12/872,938, filed on Aug. 31, 2010, now Pat. No. 8,119,310.

(51) Int. Cl.
*G03F 9/00* (2006.01)
*G06F 17/50* (2006.01)

(52) U.S. Cl. .............. 430/5; 430/22; 430/30; 382/144; 716/50; 716/136

(58) Field of Classification Search ............... 430/5, 22, 430/30; 382/144; 716/50, 53, 54, 136
See application file for complete search history.

(56) References Cited

U.S. PATENT DOCUMENTS 7,861,196 B2 * 12/2010 Huckabay et al. ............ 716/136
* cited by examiner

*Primary Examiner* — Christopher Young
(74) *Attorney, Agent, or Firm* — Slater & Matsil, L.L.P.

(57) ABSTRACT

A method includes providing a layout of an integrated circuit design, and generating a plurality of double patterning decompositions from the layout, with each of the plurality of double patterning decompositions including patterns separated to a first mask and a second mask of a double patterning mask set. A maximum shift between the first and the second masks is determined, wherein the maximum shift is a maximum expected mask shift in a manufacturing process for implementing the layout on a wafer. For each of the plurality of double patterning decompositions, a worst-case performance value is simulated using mask shifts within a range defined by the maximum shift. The step of simulating the worst-case performance includes calculating capacitance values corresponding to mask shifts, and the capacitance values are calculated using a high-order equation or a piecewise equation.

20 Claims, 15 Drawing Sheets

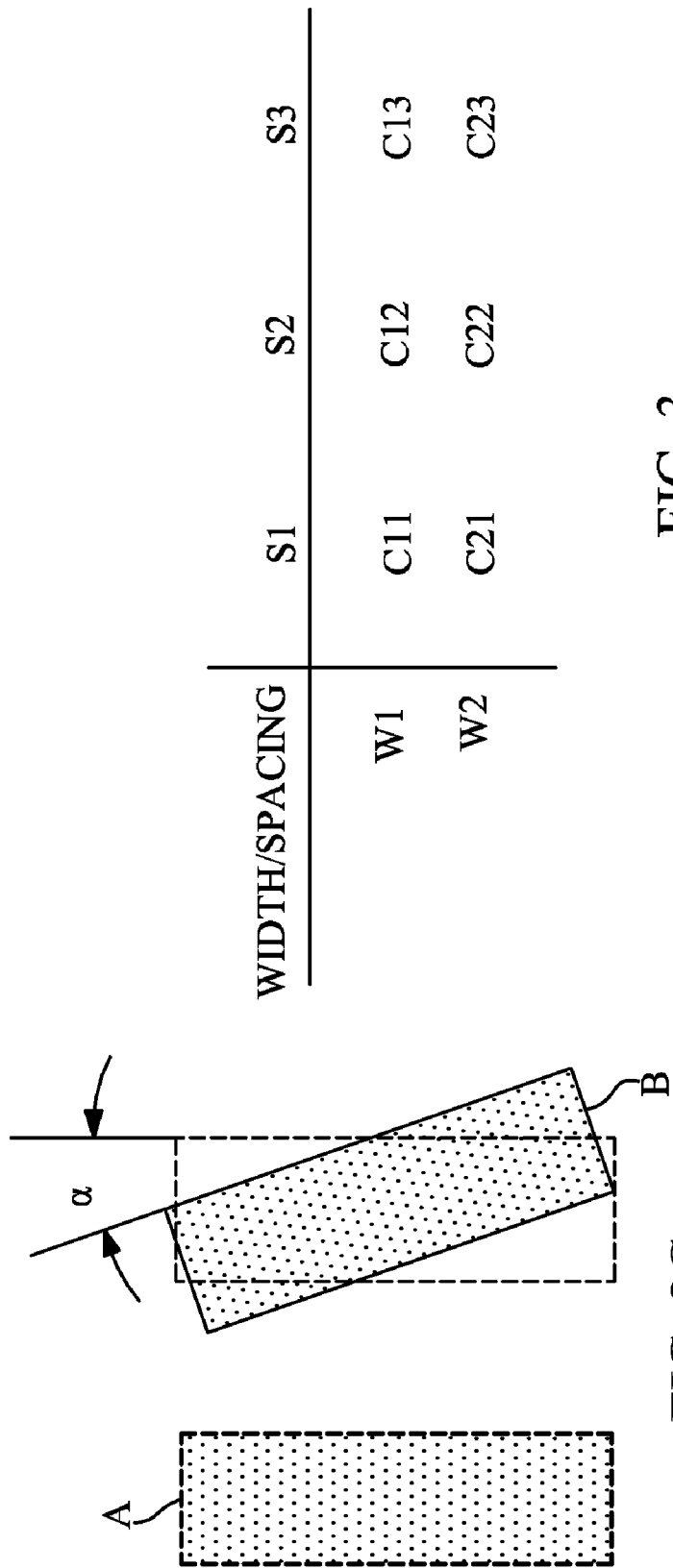

```
*VARIATION_PARAMETERS

*(INDEX NAME    MIN    MAX)
   1 M1_mask_x  -0.02  0.02
   1 M1_mask_y  -0.02  0.02
   1 M4_mask_x  -0.03  0.03
   1 M4_mask_y  -0.03  0.03

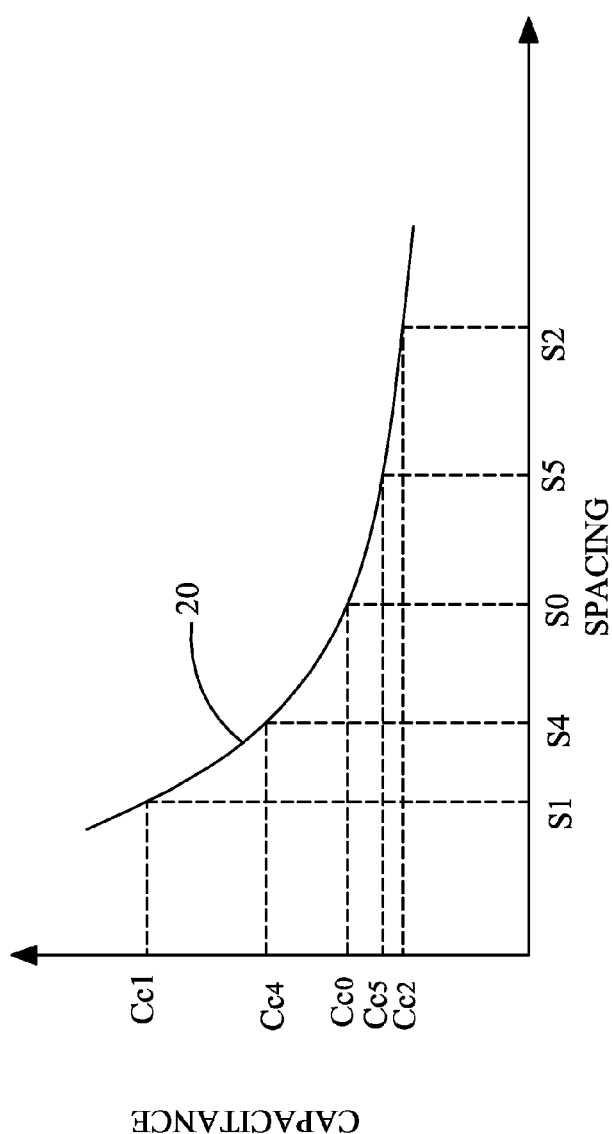
FIG. 10
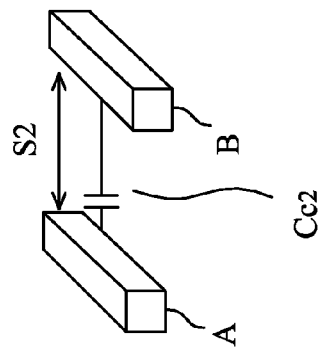
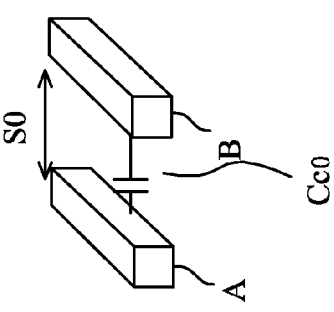
FIG. 11
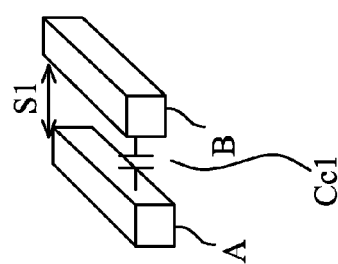

MASK-SHIFT-AWARE RC EXTRACTION FOR DOUBLE PATTERNING DESIGN

This application is a continuation-in-part of U.S. patent application Ser. No. 12/872,938, filed Aug. 31, 2010, and entitled "Mask-Shift-Aware RC Extraction for Double Patterning Design," which patent application is hereby incorporated herein by reference.

BACKGROUND

Double patterning is a technology developed for lithography to enhance the feature density. Typically, for forming features of integrated circuits on wafers, lithography technology is used, which involves applying a photo resist, and defining patterns on the photo resist. The patterns in the patterned photo resist are first defined in a lithography mask, and are implemented either by the transparent portions or by the opaque portions in the lithography mask. The patterns in the patterned photo resist are then transferred to the manufactured features.

With the increasing down-scaling of integrated circuits, the optical proximity effect posts an increasingly greater problem. When two separate features are too close to each other, the optical proximity effect may cause the features to short to each other. To solve such a problem, double patterning technology is introduced. The closely located features are separated to two masks of a same double-patterning mask set, with both masks used to expose the same photo resist. In each of the masks, the distances between features are increased over the distances between features in the otherwise a single mask, and hence the optical proximity effect is reduced, or substantially eliminated.

FIG. 1 illustrates a flow of a convention double patterning design. Referring to step 110, a layout of an integrated circuit is determined, and a netlist for the layout is provided. The layout and the netlist are fixed since the sizes and the locations of all of the polygons involved in the layout have been determined. With the fixed layout, the possible back-end-of-line (BEOL) variation, which involves the variations of the metal lines in metal layers, can be estimated (step 112). However, the variations are estimated based on the fixed layout, and hence have fixed values. Next, in step 114, (parasitic) capacitance models are established to simulate the performance value of the integrated circuits, which involves calculating capacitances for metal lines by referring to techfiles. Techfiles may store the capacitances of metal lines as the function of the spacings between metal lines, and as a function of the widths of metal lines.

After the foundary receives the layout design, a layout decomposition is performed to separate the metal lines, for example, according to the double patterning design rules. Lithograph processes are performed to implement the layout on wafers. However, it was found that there was a mismatch between the simulated performance value (step 114) and the performance value measured from the actual wafers. One of the reasons is that when the lithography processes are performed, there may be a relative shift between the two lithography masks of a same double patterning mask. Such shift, however, was not reflected in the estimation of the performance values.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 2A through 2C illustrate exemplary mask shifts;

FIG. 3 illustrates a table listing capacitances of patterns in integrated circuits as a function of the spacings between the patterns, and as a function of the widths of the patterns;

FIG. 9 illustrates a portion of a netlist including capacitances and sensitivities, wherein the netlist is extracted from a mask shift aware techfile;

FIG. 10 illustrates a line showing the capacitances of the patterns in integrated circuits as a function of the spacings between the patterns, wherein the line is represented by a high order equation;

FIG. 11 illustrates the patterns corresponding to FIG. 10;

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A novel method of finding optimum decomposition schemes and estimating the performance values of integrated circuits is provided. Throughout the various views and illustrative embodiments, like reference numbers are used to designate like elements.

Figure 1:
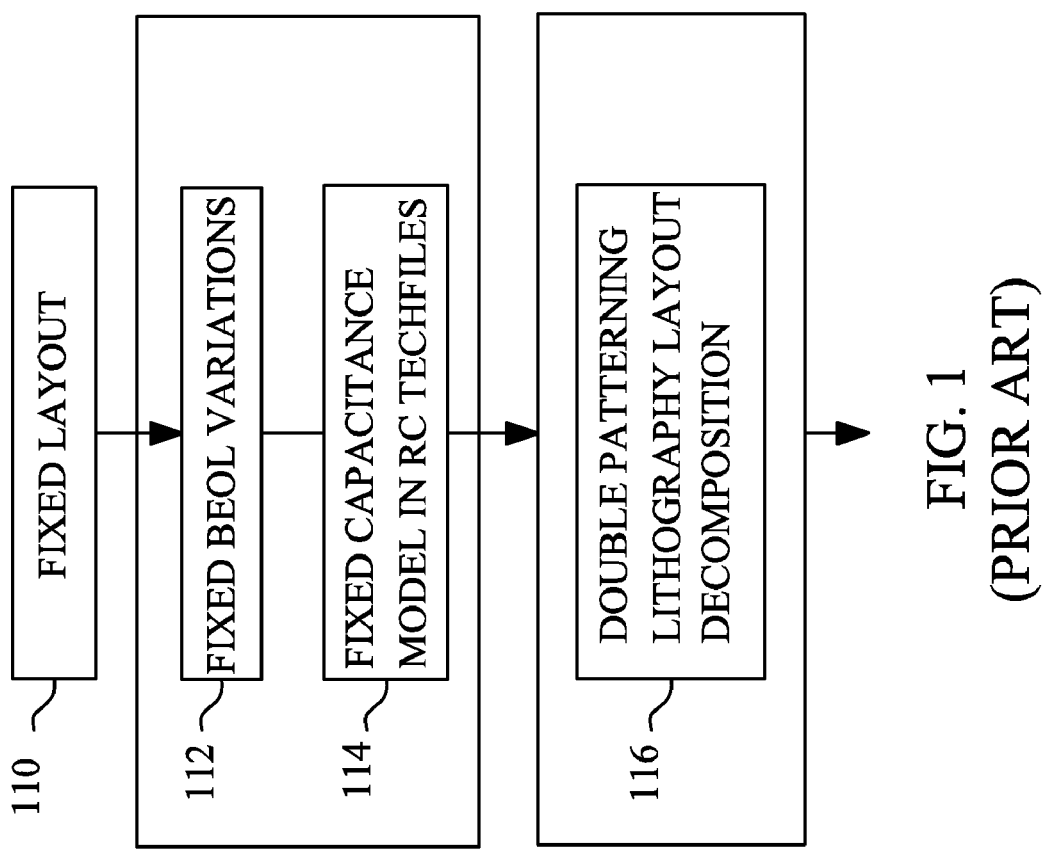
FIG. 1 illustrates a flow of a convention double patterning design.
Figure 2B:
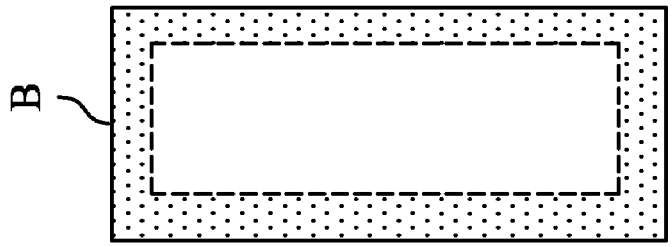
Figure 2A:
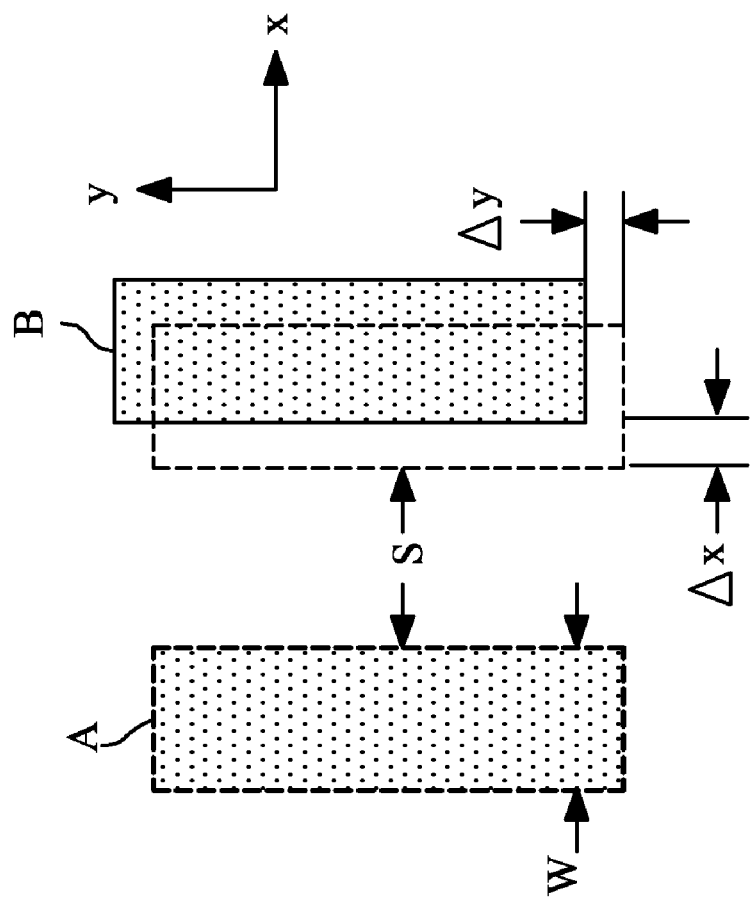

FIG. 2A illustrates a transition shift that may occur during the exposure of two patterns. Patterns A and B may be patterns in a same layer, such as a metal layer or any other layer involved in the formation of integrated circuits, such as a polysilicon layer. Patterns A and B are double patterning patterns, with pattern A being in a first lithography mask of a double patterning mask set, and pattern B in a second lithography mask of the same double patterning mask set. Accordingly, patterns A and B are formed on a wafer at different time. Ideally, pattern B should be at the position shown using dotted lines, as designed. However, there may be process variations causing pattern B to shift from the intended position. The shift may be represented as $\Delta x$ and $\Delta y$, with directions x and y being in the plane of the respective layer, which plane is also parallel to the major surfaces of the respective wafer. The shift causes the capacitance between patterns A and B to vary, and also causes the variation in performance values such as the timing and the noise, of the respective circuit.

FIG. 2B illustrates a magnification shift (wherein the term "shift" may also be referred to as "variation"), wherein one of, or both, patterns A and B may have a variation from the designed sizes. FIG. 2C illustrates a rotation shift, wherein pattern B has a relative rotation with relative to pattern A. The magnification shift and the rotation shift also cause the variation in performance values. In the following embodiments, the transition shift as shown in FIG. 2A is used as an example to explain the concept of embodiments. However, the same concept may also be used in the magnification shift and rotation shift. For example, by replacing transition shift Δx with the magnification ratio (ratio of the actual size of pattern B to the designed size), the same concept may be used for the magnification shift. Further, by replacing transition shift Δx with the rotation angle α (the angle between direction of the actual pattern B and the designed direction of pattern B), the same concept may be used for the rotation shift.

Techfiles may be established to reflect the capacitance between patterns A and B as functions of spacing S and width W (shown in FIG. 2A) of patterns A or B. FIG. 3 illustrates a table indicating what may be stored in the techfiles. It is realized that the techfiles may use any format to store the information as shown in FIG. 3. In FIG. 3, it is observed that the change in widths W and/or spacing S results in the change in the capacitance between patterns A and B. For example, if width W is equal to W1, and spacing S is equal to S1, the respective capacitance is C11. If width W is equal to W1, and spacing S is equal to S2, the respective capacitance is C12. The contents in the techfiles may be retrieved in the subsequent simulation of the circuit performance value to speed up the simulation.

Figure 4:
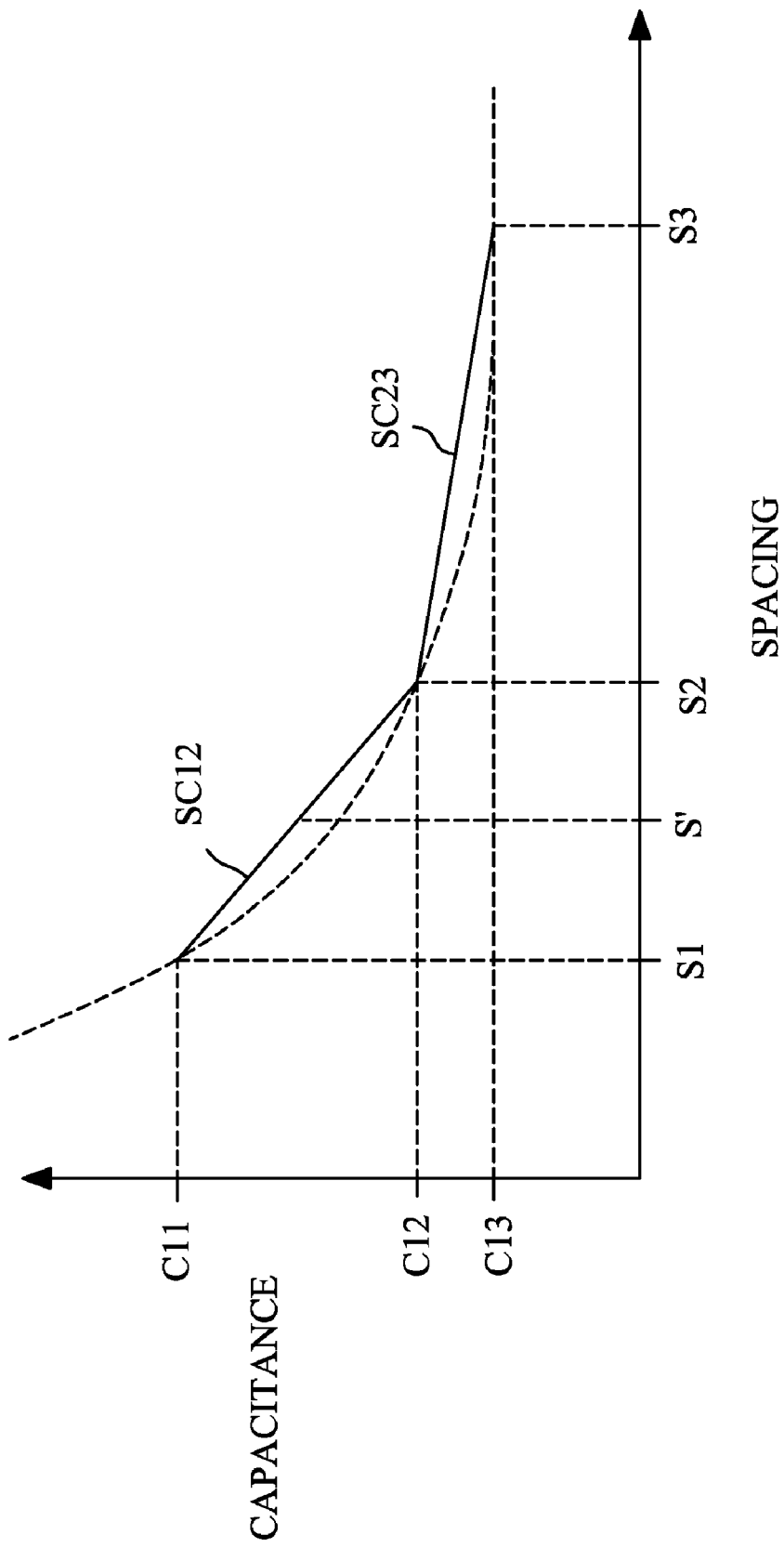
FIG. 4 illustrates a graph showing the capacitances of the patterns in integrated circuits as a function of the spacings between the patterns.

FIG. 4 illustrates the capacitance between patterns A and B as a function of spacing S. The dotted and curved line illustrates the actual capacitance. It is observed that only limited number of techfile items may be stored to reflect the relationship shown in FIG. 4, and there may be values not stored in the techfiles. For example, if spacing S' between two patterns is between spacings S1 and S2, then the capacitance corresponding to spacing S' cannot be retrieved from the techfiles directly. Accordingly, the sensitivity of capacitance to spacing S is established so that the capacitance corresponding to spacing S' may be calculated.

Figure 5:
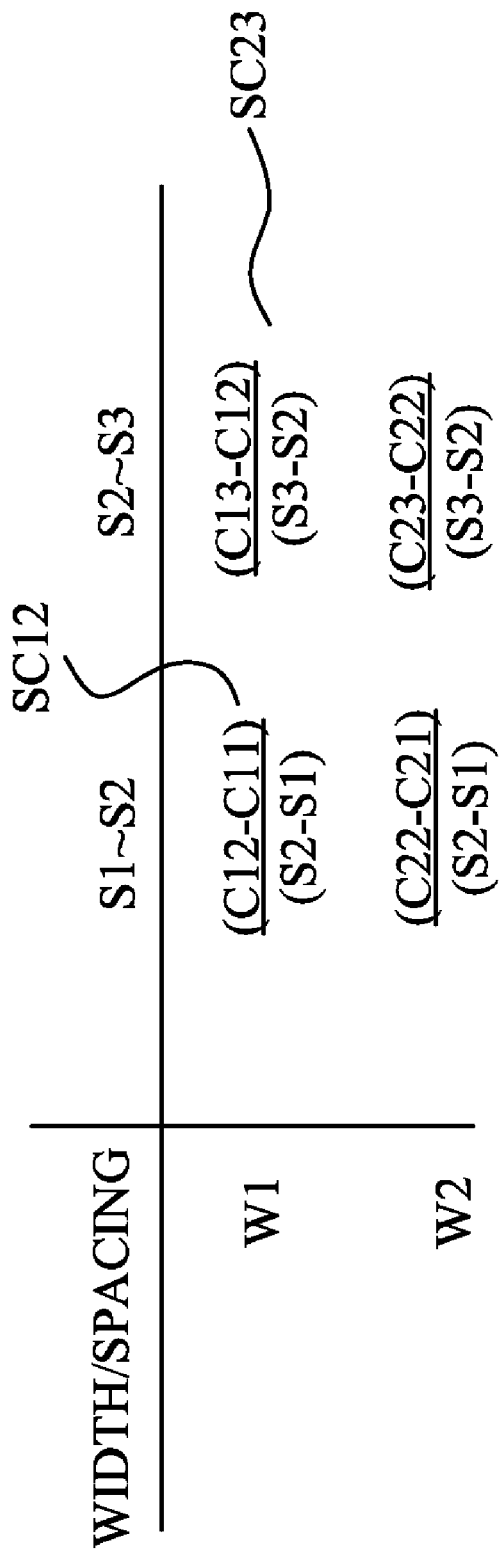
FIG. 5 illustrates a table listing capacitance sensitivities of the patterns in integrated circuits as a function of the spacings between the patterns, and as a function of the widths of the patterns.

FIG. 5 illustrates the sensitivity of capacitance to spacing S, wherein the sensitivity is related to the range spacing S' is in. Further, the sensitivity of capacitance is related to the respective line widths of patterns A and/or B. It is observed that sensitivity (C12-C11)/(S2-S1) is the slope SC12 (FIG. 4) of the solid line that is between spacings S1 and S2, and sensitivity (C13-C12)/(S3-S2) is the slope SC23 (FIG. 4) of the solid line that is between spacings S2 and S3. From FIG. 4, it is realized that if a spacing falls into any of the ranges between S1 and S2, or between S2 and S3, the respective capacitance may be calculated. The concept is further explained using FIGS. 6 through 8 and Equation 3.

Figure 6:
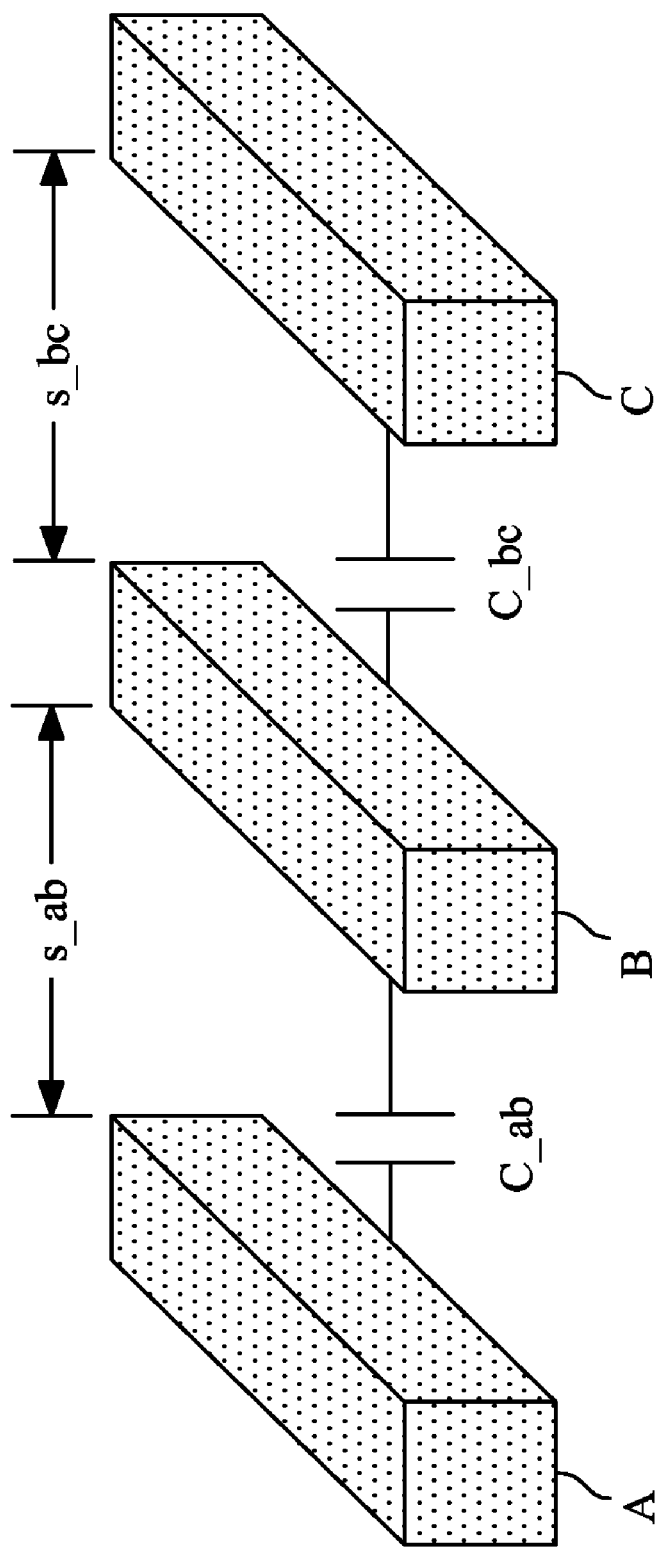
FIG. 6 illustrates the spacings between three patterns when no mask shift occurs.
Figure 7:
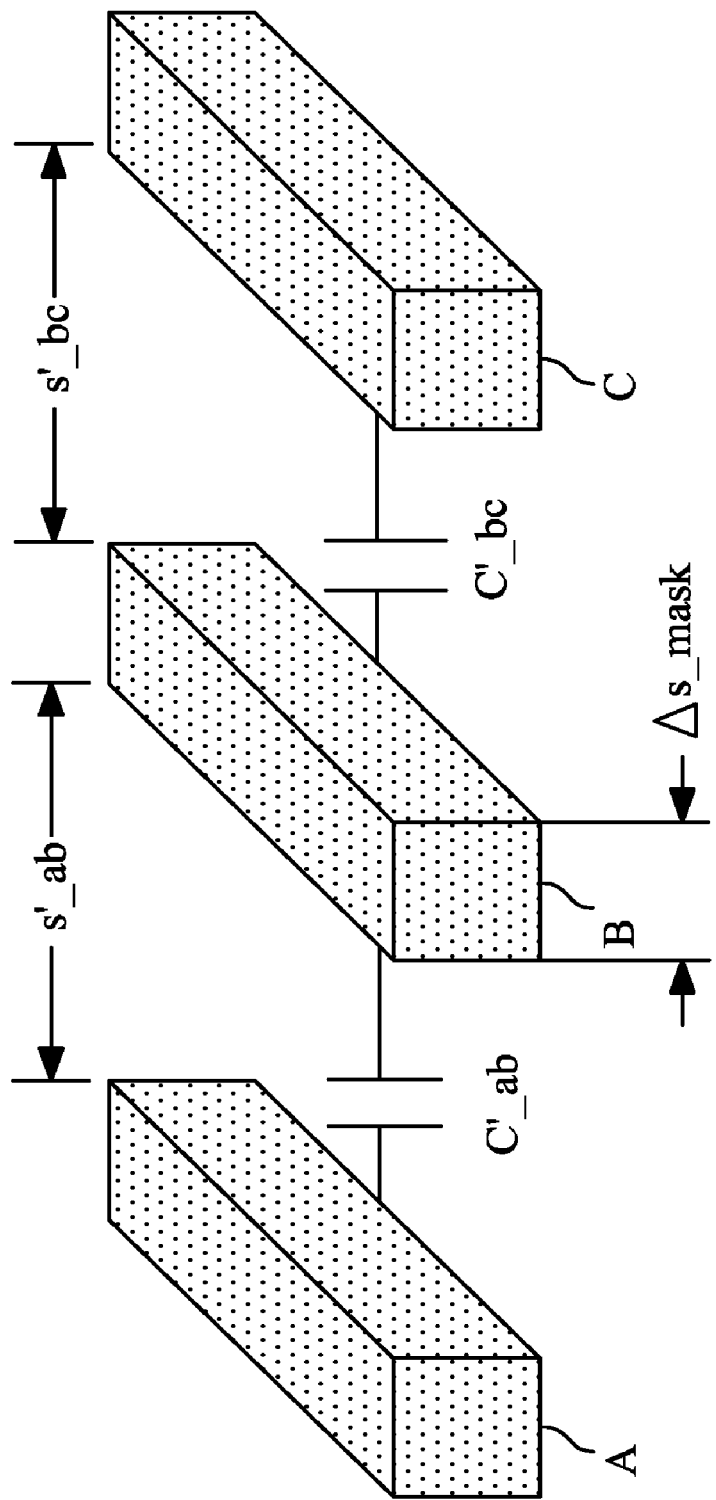
FIG. 7 illustrates the spacings between three patterns with a mask shift.

Referring to FIG. 6, patterns A, B, and C are double patterning patterns, with patterns A and C being in a first lithography mask of a double patterning mask set, and pattern B in a second lithography mask of the same double patterning mask set. FIG. 6 illustrates the as-designed spacings S_ab and S_bc, and the respective capacitances C_ab and C_bc.

Figure 8:
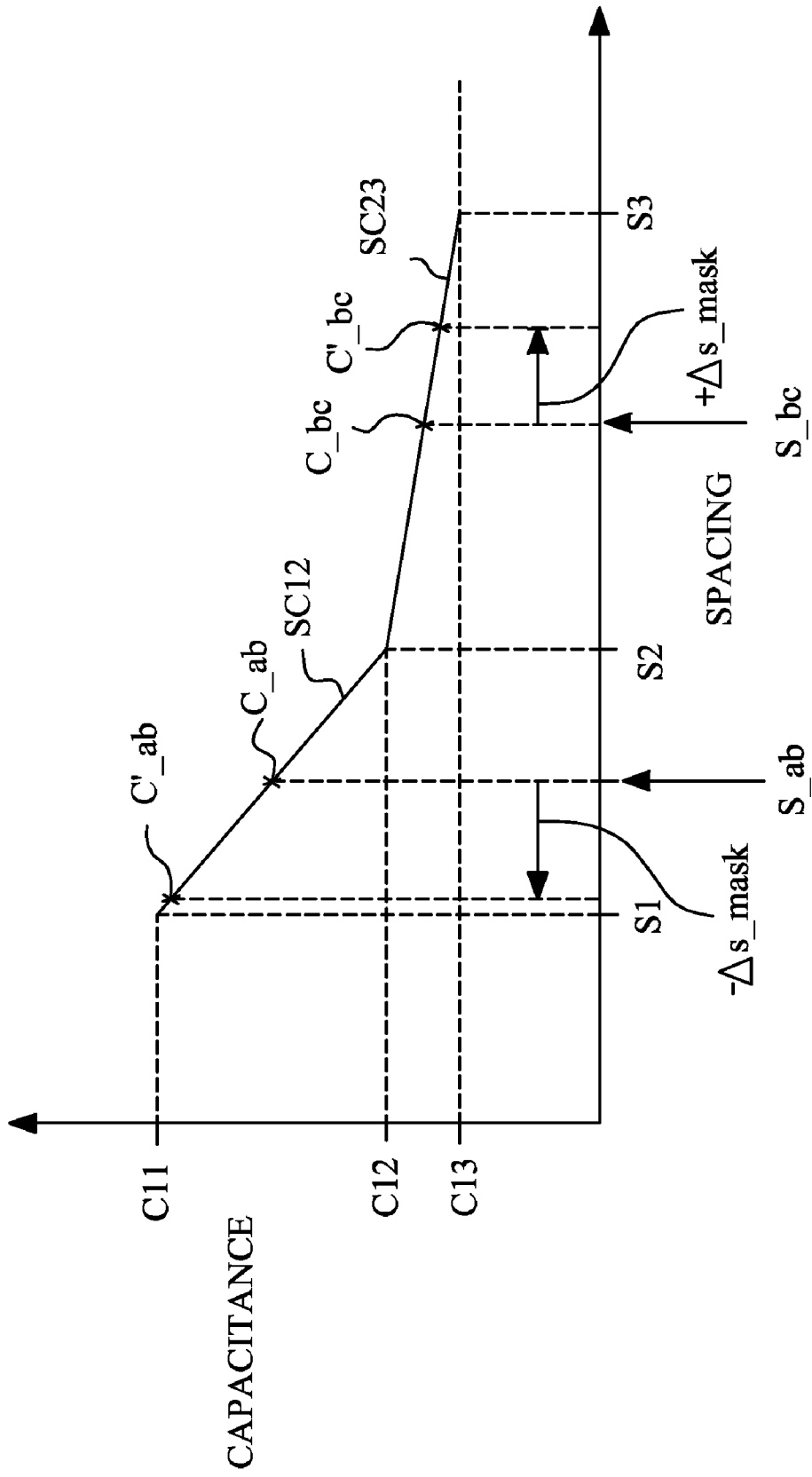
FIG. 8 illustrates the change in the capacitance between the patterns due to the mask shift.

If a transition shift occurs to cause mask shift Δs_mask (FIG. 7), then the capacitance between patterns A and B is changed to C'_ab, and the capacitance between patterns B and C is changed to C'_bc. The change in the capacitances may be generally expressed as the sensitivity of capacitance times mask shift Δs_mask. Accordingly, as illustrated in FIG. 8, the new capacitances C'_ab and C'_bc with mask shifts may be expressed as:

$$C'\_ab = C\_ab + SC12*(-\Delta s\_mask) \quad [\text{Eq. 1}]$$

$$C'\_bc = C\_bc + SC23*(+\Delta s\_mask) \quad [\text{Eq. 2}]$$

Wherein SC12 is the sensitivity (FIG. 4) corresponding to spacing range S1-S2, in which the new S'_ab falls into, and SC23 is the sensitivity corresponding to spacing range S2-S3, in which the new S'_bc falls into.

Since mask shift Δs_mask may include the mask shift Δx in the x direction and the mask shift Δy in the y direction, the new capacitance C (with the mask shift) between two patterns may be expressed as:

$$\begin{aligned} C &= f(s + \Delta s\_mask) \quad [\text{Eq. 3}]\\ &= C_0 + \frac{\partial C}{\partial s}\Delta s\_mask\\ &= C_0 + \frac{\partial Cx}{\partial x}(\pm \Delta x) + \frac{\partial Cy}{\partial y}(\pm \Delta y) \end{aligned}$$

Wherein $$\frac{\partial Cx}{\partial x}$$

is the sensitivity of capacitance to the mask shift in x direction, and $$\frac{\partial Cy}{\partial y}$$

is the sensitivity of capacitance to the mask shift in y direction, and $C_0$ is the capacitance if no mask shift occurs. Equation 3 may further be modified to include the factors of magnification shift and the rotation shift.

In an embodiment, the capacitances between patterns (FIG. 3) and the capacitance sensitivities may be stored in the techfile(s) for the later retrieval. For example, FIG. 9 illustrates an exemplary format of a portion of a netlist including the capacitances and the capacitance sensitivities, wherein the portion of the netlist is extracted from a mask shift aware techfile. The line starting with index "1" indicates the maximum shift in metal layer 1 (M1), and the maximum mask shift in x direction is between −0.02 μm, which is in −x direction, and 0.02 μm in +x direction. It is noted that different netlist format may have different definitions, such as 1 sigma, 2 sigmas, 3 sigmas, and the like, wherein 3 sigma may have the exemplary value of 0.02 μm. Similarly, the lines starting with indices 2, 3, and 4 represent maximum shifts in layers M1 and M4, and in x and y directions. The maximum shifts are the possible (expected) maximum mask shifts that may occur, and it is expected that the respective mask shifts when the layout of the respective integrated circuit is implemented on an actual wafer will not possibly exceed these values. The maximum shifts are also used to calculate the maximum performance variation.

Further, the techfile item "C1 A B 5.6e-15*SC 1:-0.048 2:-0.024" represents that the capacitance C1 between nodes A and B is 5.6e-15 farads if no mask shift occurs, and the sensitivity of capacitance is −0.048 in layer M1 (for mask shifts in the x direction), and is −0.024 in layer M1 (for mask shifts in the y direction). Accordingly, with such a techfile, if a mask shift is known (or is assumed), the respective capacitance as a result of the mask shift may be calculated using the techfile and Equation 3.

Equation 3 may reflect the relationship between mask shifts Δx and Δy and the capacitance of the respective patterns when mask shifts Δx and Δy are small. When the values of mask shifts Δx and Δy increase, Equation 3 may not be able to reflect the relationship accurately. For example, referring to FIG. 4, assuming mask shift (S2-S1) is equal to mask shift (S3-S2), value (C12-C13) is not equal to (C11-C12), which deviates from Equation 3. In the example as shown in FIG. 4, value (C11-C12) is greater than value (C12-C13). With the increase in the mask shifts (S2-S1) and (S3-S2), the difference between values (C12-C13) and (C11-C12) also increases. Accordingly, a high-order approach may be used to accurately reflect the relation between spacings of patterns and the capacitances of the patterns, which relationship may also be saved in the techfile.

FIG. 10 illustrates a graph showing the capacitances of patterns/polygons (for example, patterns A and B as in FIG. 11) in integrated circuits as a function of the spacings between the patterns. Referring to FIG. 11, the capacitors between patterns A and B have capacitance values $C_{c0}$, $C_{c1}$, and $C_{c2}$, respectively when the spacings are S0, S1, and S2, respectively. Although not shown, it is recognized that if the spacings between patterns A and B have different values such as S4 and S5, the respective capacitance values will be $C_{c4}$, $C_{c5}$, respectively.

Referring back to FIG. 10, line 20 represents the actual relationship between the capacitances (between patterns A and B) and the spacings, which relationship is at least close to the actual performances of patterns A and B when patterns A and B are formed on physical semiconductor chips. Line 20 may be obtained from experiments, for example, by forming a plurality of sample patterns A and B on physical chips, with the sample patterns having a plurality of different spacings. The respective capacitances between the sample patterns are measured to draw line 20. Alternatively, line 20 may be obtained from simulations. The simulations may be performed using tools such as SYNOPSYS's Raphael simulation tool, which is able to take into the consideration of process variations of actual patterns on chips.

In a embodiment, line 20 may be represented by a high-order equation, which is expressed as Equation 4:

$$C_c = C_{c0} + \sum_{i=1}^{N} a_i * (S - S0)^i \qquad \text{[Eq. 4]}$$

Wherein parameter $C_c$ represents the capacitance value when spacing is S (refer to line 20), $C_{c0}$ represents the capacitance of a reference point (also referred to as an initial point) on line 20, and S0 represents the spacing value of the reference/initial point. Value (S−S0) (or a difference between any two spacings) may represent the mask shift. The high-order equation may be chosen to have two, three, or higher orders. For example, if a two-order equation or a three-order equation is desirable, then Equation 4 may be expressed as Equation 5 or 6:

$$C_c = C_{c0} + a_1*(S-S0) + a_2*(S-S0)^2 \qquad \text{[Eq. 5]}$$

Or $$C_c = C_{c0} + a_1*(S-S0) + a_2*(S-S0)^2 + a_3*(S-S0)^3 \qquad \text{[Eq. 6]}$$

To obtain Equation 4, parameters $C_{c0}$, $S_0$, $a_1$, $a_2$, $a_3$, and the like need to be obtained. For example, to obtain Equation 5, values a1 and a2 need to be known. $C_{c0}$ and S0 are values of point (S0, $C_{c0}$) in line 20, and are known. Accordingly, values of two more points such as point (S1, $C_{c1}$) and (S2, $C_{c2}$) may be substituted into equation 5 to generate two equations, with capacitances $C_{c1}$ and $C_{c2}$ substituting $C_c$, and spacings S1 and S2 substituting S. With the two equations, two parameters $a_1$ and $a_2$ can be solved. Similarly, to solve a three-order equation such as Equation 6, three points may be used to obtain three equations, so that parameters $a_1$, $a_2$, and $a_3$ can be solved. To ensure the accuracy of the high-order equations, the points selected for solving the equations may be spread evenly, with substantially equal distances between the points. In addition, the points selected for solving the equations should not be too close to each other.

After the high-order equation is obtained, parameters $C_{c0}$, S0, $a_1$, $a_2$, $a_3$, and the like, which characterize the high-order equation, may be saved in the techfile. For example, in a techfile, one techfile item (which may be similar to what is shown in FIG. 9) may include parameters $C_{c0}$, S0, $a_1$, $a_2$, and $a_3$. In addition, for different polygon (pattern) pairs having different structures (for example, in different metal layers), the equations may be different, and hence the parameter of the equations are different.

At the time a capacitance of two patterns needs to be calculated (for example, in step 24 in FIG. 16), parameters $C_{c0}$, S0, $a_1$, $a_2$, $a_3$, and the like may be retrieved from the techfile, and Equation 4 is constructed and used to calculate the capacitance.

Figure 12:
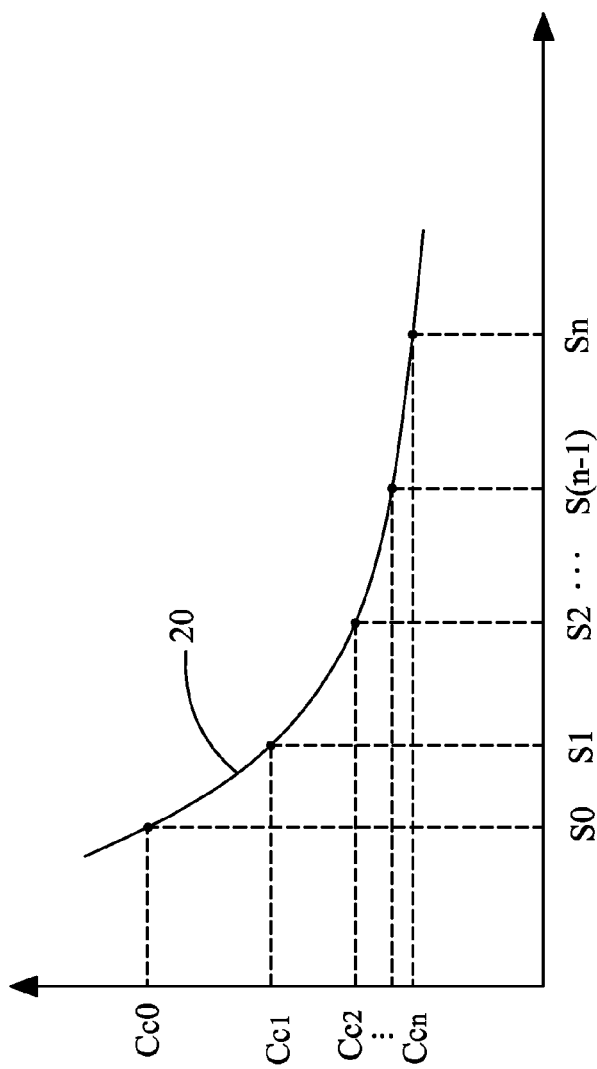
FIG. 12 illustrates a line showing the capacitances of the patterns in integrated circuits as a function of the spacings between the patterns, wherein the line is represented by a piecewise equation.
Figure 13:
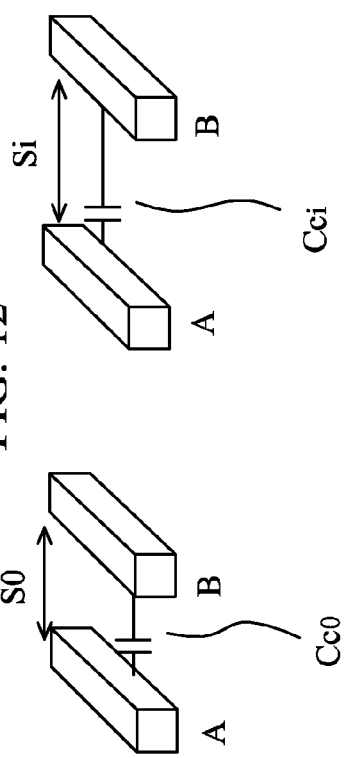
FIG. 13 illustrates the patterns corresponding to FIG. 12.

FIGS. 12 and 13 illustrate a piecewise approach for characterizing the relationship between capacitance values and the spacings between patterns/polygons. Referring to FIG. 12, line 20 is obtained, for example, using essentially the same method as described for FIG. 10. Referring to FIG. 13, the capacitors formed between patterns A and B have capacitance values $C_{c0}$ and $C_{ci}$, respectively, when the corresponding spacings are S0 and Si, respectively. Spacing Si may represent any of spacings S1, S2, S3, S4, and the like, and the respective capacitance values are $C_{c1}$, $C_{c2}$, $C_{c3}$, $C_{c4}$, respectively.

For the piecewise approach, line 20 as in FIG. 12 is divided into n segments between starting point (S0, $C_{c0}$) and ending point (Sn, $C_{cn}$). Spacings S1, S2, S3 . . . S(n−1) are the dividing points of neighboring segments. The dividing points may be distributed substantially evenly, so that neighboring points have substantially equal distances. The total count n of the segments is greater than three, and may be any integer greater than three, such as four, five, six, or the like. The capacitance $C_c$ of two patterns A and B having spacing S may be expressed as:

$$C_c = C_{c0} + \sum_{i=1}^{J-1} b_i * (Si - S(i-1)) + b_J * (S - S(J-1)) \qquad \text{[Eq. 7]}$$

Wherein parameter $C_{c0}$ represents an initial/reference capacitance that correspond to initial/reference spacing S0, value (J−1) represents the number of whole segments between spacings S0 and S, and spacings Si, S(i−1), and S(J−1) are the dividing points that separate neighboring segments. Value (S−S0) or the difference between any two spacing values may represent the mask shift. Values $b_i$ and $b_J$ are sensitivity coefficients, and spacing S, which corresponds to capacitance $C_c$, is in the segment between spacings S(J−1) and SJ, with J being any integer value between 1 and n. For example, if spacing S is between spacings S4 and S5, J is equal to 5. Furthermore, sensitivity coefficients $b_j$ in the segment that is between S(j−1) and Sj may be expressed as:

$$b_j = (C_{cj} - C_{c(j-1)})/(Sj - S(j-1)) \quad [\text{Eq. 8}]$$

wherein j may be any integer between (and including) 1 and n.

According to Equation 7, capacitance $C_c$ is calculated by adding the initial reference capacitance $C_{c0}$ to the changes in capacitance caused by each of the segments that are in the range between spacings S0 and S. Similar to Equation 7, if line 20 is divided into n segments, (n+1) points on line 20 are needed to obtain n equations, wherein sensitivity coefficients $b_1$ through $b_n$ are the variables in the n equations. With the n equations, variables $b_1$ through $b_n$ may be obtained. After Equation 7 is solved, any capacitance $C_c$ corresponding to any spacing S, with spacing S being between S1 and Sn, may be solved through Equation 7.

After the piecewise equation 7 is obtained, parameters $C_{c0}$, S0 through Sn, and $b_1$ through $b_n$, which characterize the piecewise equation 7, may be saved in the techfile. For example, in a techfile, one item (such as one line) may include $C_{c0}$, S0 through Sn, and $b_1$ through $b_n$. In addition, for different polygons pairs having different structures (for example, in different metal layers), the respective piecewise equations may be different, and hence the parameter of the equations are different. Accordingly, for a plurality of polygon pairs having different structures, one techfile item may be saved, with each techfile item having its own values of $C_{c0}$, S0 through Sn, and $b_1$ through $b_n$.

At the time a capacitance of two patterns needs to be calculated (for example, in step 24 in FIG. 16), values $C_{c0}$, S0 through Sn, and $b_1$ through $b_n$, and the like may be retrieved from the techfile, and Equation 7 is constructed and used to calculate the capacitance.

Figure 14:
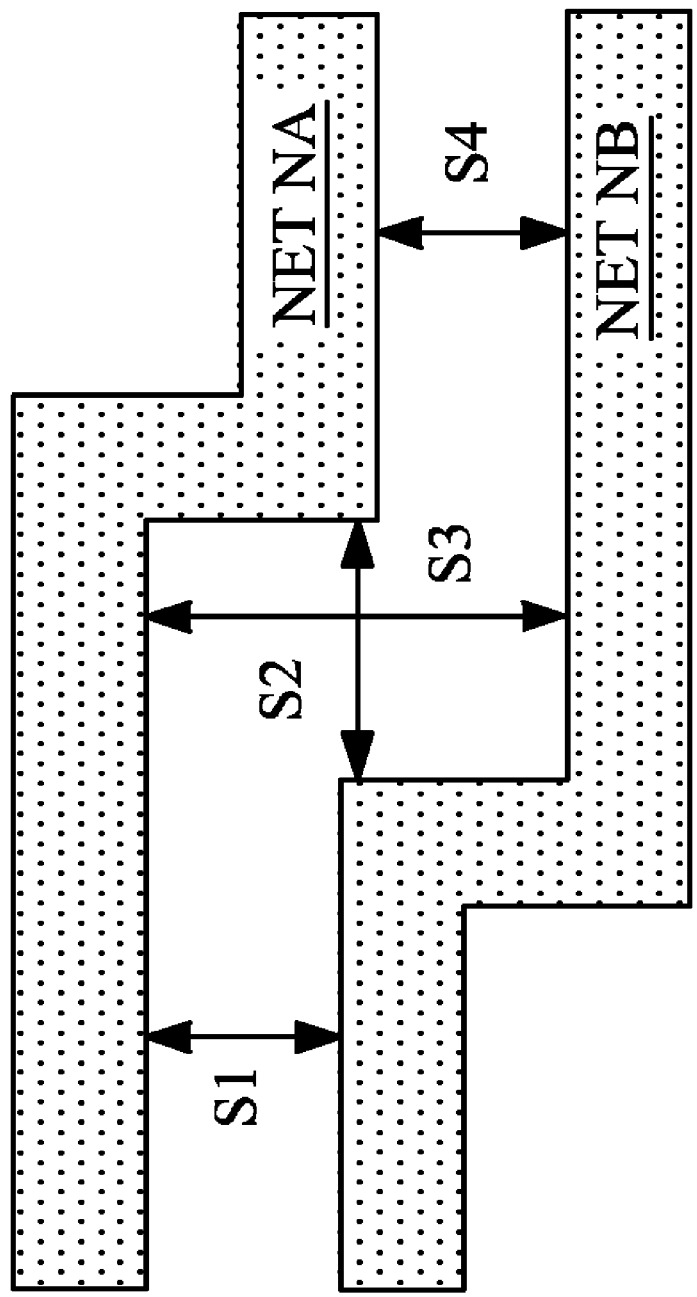
FIGS. 14 through 15B illustrate how nets in a layout are decomposed into different double patterning mask sets.
Figure 15A:
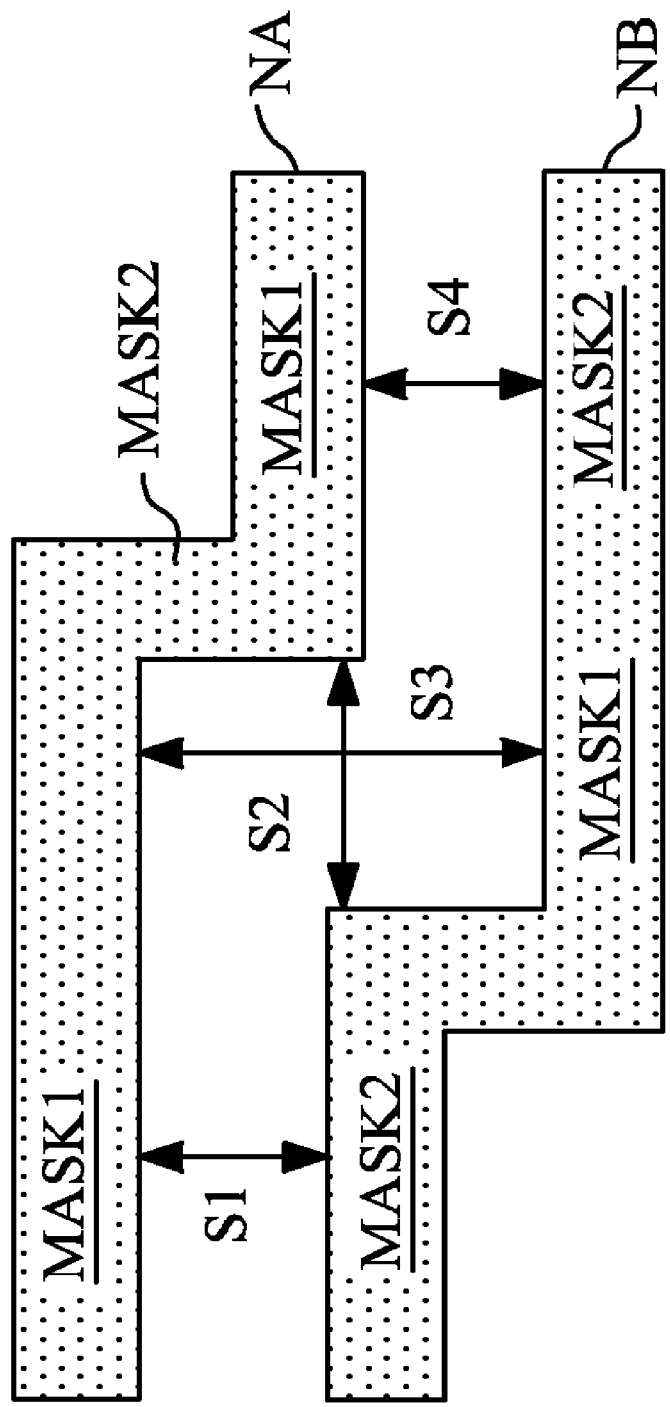
Figure 15B:
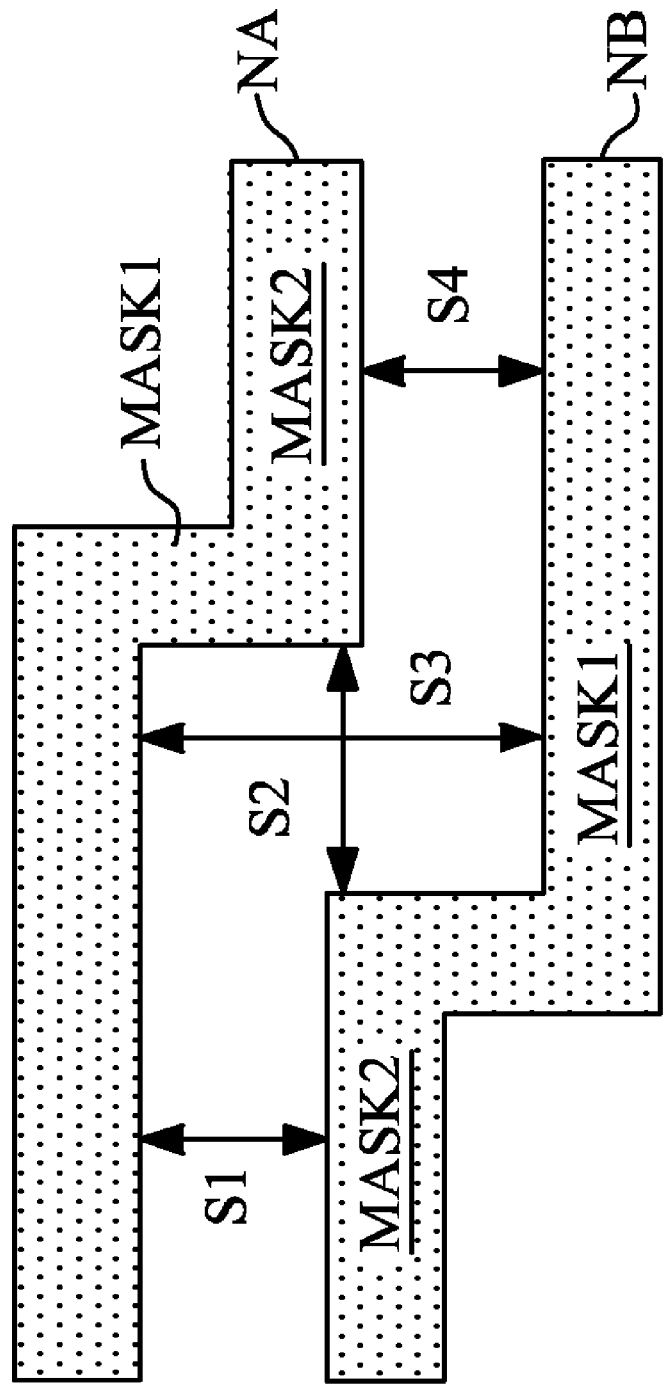

FIGS. 14 through 15B illustrate how layout decompositions are achieved for double patterning. Referring to FIG. 14, two nets (also referred to as patterns throughout the description) NA and NB are illustrated. Throughout the description, the term "net" refers to electrically connected metal lines and vias, wherein all metal lines (in the same and/or different metal layers) connected together, and hence have the same voltage potential, are referred to as being in a same net. The metal lines in the same net but are in different metal layers are interconnected through vias. Different portions of nets NA and NB have spacings S1, S2, S3, S4, and the like. According to the requirement of double patterning technology, if the spacing between any two patterns is less than a minimum spacing (known as G0) set by design rules, the two patterns should be decomposed into two masks of a double patterning mask set. Assuming spacings S1, S2, and S4 are smaller than G0, nets NA and NB need to be decomposed. There may be a plurality of schemes of performing the decomposition. For example, FIGS. 15A and 15B illustrate two schemes. It is realized since there are many nets in a circuit layout, there are many schemes of performing the decomposition. In FIGS. 15A and 15B, different sections of nets NA and NB are separated into lithography masks mask1 and mask2, which are in a same double patterning lithography mask set. Throughout the description, the decomposition schemes as shown in FIGS. 15A and 15B are referred to as decompositions 15A and 15B hereinafter.

As addressed in preceding paragraphs when the integrated circuit (layout) is manufactured on wafers, masks mask1 and mask2 may have a mask shift with relative to each other, which includes a transition shift, a magnification shift, and/or a rotation shift (FIGS. 2A through 2C). Accordingly, since the patterns of mask1 and mask2 in decompositions 11A and 11B are different, the performances of the resulting circuits formed using decompositions 11A and 11B are different from each other. At the time of design, it cannot be predicted what the actual mask shift will be when the integrated circuit is manufactured. However, the worst-case performance values resulted from the mask shift for decomposition 11A may be simulated, and the worst-case performance values resulted from the mask shift for decomposition 11B may also be simulated. Accordingly, by selecting the decomposition whose worst-case performance values are the best among the worst-case performance values of all available decompositions, it can be guaranteed that even if the worst-case scenario occurs, the minimum performance value requirement for the integrated circuit can still be satisfied, and the optimum performance value can be achieved.

Figure 16:
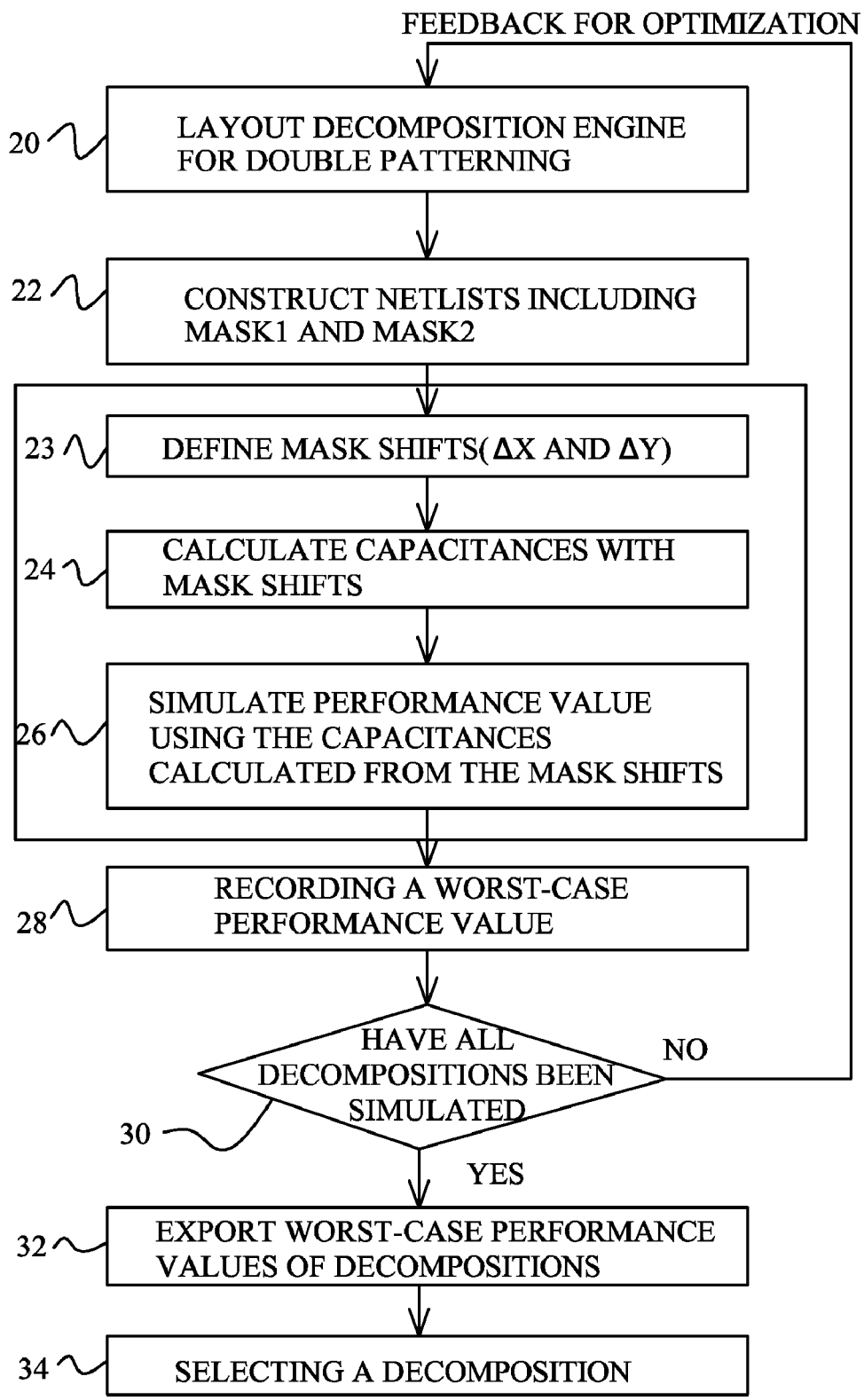
FIG. 16 illustrates a flow of a double patterning design in accordance with an embodiment.

FIG. 16 illustrates the flow of finding the optimum decomposition in accordance with an embodiment. Referring to step 20, a layout of an integrated circuit is provided to a decomposition engine for performing decomposition. All available decompositions (such as schematically illustrated in FIGS. 15A and 15B) are generated by the decomposition engine. For each of the decompositions, a netlist is generated (step 22), wherein the netlist includes patterns in mask1 and mask2 that belong to a same double patterning mask set, for example.

Next, in step 23, mask shifts are defined, and may include Δx and Δy that are transition shifts. In addition, mask shifts may also include the magnification shift and the rotation shift. In the techfiles, the maximum mask shift for each of the metal layers has been defined. Accordingly, mask shifts Δx and Δy are defined as being within the range of the maximum shifts as defined in the techfiles. For example, as shown in FIG. 9, in metal layer M1, the maximum transition shift in −x direction is 0.02 (the unit is not listed since this is an example), and the maximum transition shift in +x direction is 0.02. Accordingly, it is known that for each decomposition, the shifts in metal layer M1 and in the +x/−x direction will not exceed 0.02, although the real mask shift at the manufacturing time cannot be predicted.

Since the actual mask shift may be at any value less than the maximum mask shift, the range defined by the maximum shift may be divided into steps, and for each of the steps, the performance value of the circuit may be simulated. For example, assuming a maximum shift is 0.02, then it can be assumed that the actual mask shift may be 0.005, 0.01, 0.015, or 0.02. For each of these four assumed mask shifts, the performance values of the circuit may be simulated. Referring to FIG. 2A as an example, the capacitance between patterns A and B without any mask shift is already included in the techfiles, or can be calculated. Further, the capacitance between patterns A and B when the mask shifts (for example, the shift in the x direction) is 0.005, 0.01, 0.015, or 0.02 can be calculated using Equation 3 and the sensitivity of capacitance in the techfiles.

Similar to the mask shift in the x direction, the mask shift in the y direction also has a maximum shift, as also shown in FIG. 9. Further assuming that the maximum shift 0.02 of metal layer M1 in the y direction is also divided into four steps, then there are 16 combinations. If the magnification shift and the rotation shift are further taken into account, there are even more combinations. In step 24, for each of the combinations, the respective capacitance is calculated using linear Equation 3, high-order Equation 4, or piecewise Equation 7.

In alternative embodiments, the maximum mask shifts listed in the techfiles are used directly to calculate the performance value without being divided into steps. Accordingly, for each of the decompositions, the calculation is much faster.

Next, as shown in step 26, the corresponding performance values, such as the timing (of critical paths, for example) and noise, for each of the above-discussed mask shift combinations may be simulated using the capacitances already calculated in step 24. The methods for simulating the performance values from the capacitances are known in the art, and hence are not discussed herein. The performance values obtained from different mask shift combinations are compared to find the worst-case performance value, for example, the worst timing of critical paths. Again, although the actual mask shift at manufacturing time cannot be predicted, the performance value of the circuit when the worst-case scenario occurs is already obtained, and will be recorded in step 28.

The process steps as in the embodiments may be performed by a computer, which includes software and hardware. Furthermore, the intermediate and final results of the embodiments may be saved on non-transitory computer-readable medium such as hard drives, discs, and the like. For example, the various layout patterns such as what are shown in FIGS. 2A-2C, 6, 7, 11, and 13, the techfiles as shown in FIG. 9 and corresponding to Equations 3 through 8, the layouts of the integrated circuits as processed (step 20 in FIG. 16), and the compositions (which include the double patterning patterns) may be saved on the non-transitory computer-readable medium. In addition, process steps 20 through 34 as shown in FIG. 16 may also be executed by a computer, which retrieves program codes for performing the steps in process steps 20 through 34. The program codes may also be saved on a non-transitory computer-readable medium such as hard drives, discs, and the like.

The worst-case performance value obtained in preceding steps is for one of the decompositions, a loop is used to calculate/estimate the worst-case performance value for each of the available decompositions obtained in step 20. In the loop, it is determined (step 30) whether the worst-case performance values of all decompositions have been calculated, and if not, a calculation is performed for the next decomposition. If the worst-case performance values of all decompositions have been calculated, the worst-case performance values are exported (step 32) for further examination. In an embodiment, the decomposition whose worst-case performance value is the best among the worst-case performance values of all decompositions may be selected (step 34), and is used to make physical double patterning lithography masks mask1 and mask2. The integrated circuit will then be manufactured on wafer using the selected decomposition.

With the worst-case performance values being estimated, designer, at the time of design, may perform a design margin analysis and check whether the worst-case performance, such as the worst-case timing or the worse-case noise, is in the design margin or not. Further, with the adoption of the decomposition whose worst-case performance value being the best among all available decompositions, foundaries may manufacture integrated circuits using the best decomposition scheme.

In accordance with embodiments, a method includes retrieving a layout of an integrated circuit design from a non-transitory computer-readable storage medium. A plurality of double patterning decompositions is generated from the layout, with each of the plurality of double patterning decompositions comprising patterns separated to a first mask and a second mask of a double patterning mask set. A maximum shift between the first and the second masks is determined, wherein the maximum shift is a maximum expected mask shift in a manufacturing process for implementing the layout on a wafer. For each of the plurality of double patterning decompositions, a worst-case performance value is simulated. The step of simulating is performed using mask shifts within a range defined by the maximum shift, and wherein the step of simulating includes calculating a capacitance of patterns from a spacing between the patterns, wherein the step of calculating is performed using a high-order equation or a piecewise equation. The high-order equation represents capacitances of the patterns as a high-order function of the spacings. The piecewise equation represents the capacitances as a piecewise function of the spacings.

In accordance with alternative embodiments, a method includes retrieving a layout of an integrated circuit design from a non-transitory computer-readable storage medium. A plurality of double patterning decompositions is generated from the layout, with each of the plurality of double patterning decompositions including patterns separated to a first mask and a second mask of a double patterning mask set. Capacitances of patterns in the layout are determined as a function of spacings between the patterns, wherein the function is represented by a high-order equation having an order equal to or greater than two. A maximum shift between the first and the second masks is determined, wherein the maximum shift is a maximum expected shift in a manufacturing process for implementing the layout on a silicon wafer. A new capacitance of the patterns is calculated using the maximum shift and the high-order equation. For each of the plurality of double patterning decompositions, the new capacitance is used to calculate a performance value. The performance values of the plurality of double patterning decompositions are compared to select one of the plurality of double patterning decompositions, with the performance value of the one of the plurality of double patterning decompositions being the best among all of the plurality of double patterning decompositions. A double pattering mask set is manufactured using the one of the plurality of double patterning decompositions.

In accordance with yet other embodiments, a method includes retrieving a layout of an integrated circuit design from a non-transitory computer-readable storage medium. A plurality of double patterning decompositions is generated from the layout, with each of the plurality of double patterning decompositions comprising patterns separated to a first mask and a second mask of a double patterning mask set. Capacitances of patterns in the layout are determined as a function of spacings between the patterns, wherein the function is represented as a piecewise equation, with the spacings segmented into at least three segments. A maximum shift between the first and the second masks is determined, wherein the maximum shift is a maximum expected shift in a manufacturing process for implementing the layout on a silicon wafer. A new capacitance of the patterns is calculated using the maximum shift and the piecewise equation. For each of the plurality of double patterning decompositions, the new capacitance is used to calculate a performance value. The performance values of the plurality of double patterning decompositions are compared to select one of the plurality of double patterning decompositions, with the performance value of the one of the plurality of double patterning decompositions being the best among all of the plurality of double patterning decompositions. A double pattering mask set is manufactured using the one of the plurality of double patterning decompositions.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
retrieving a layout of an integrated circuit design from a non-transitory computer-readable storage medium;
generating a plurality of double patterning decompositions from the layout, with each of the plurality of double patterning decompositions comprising patterns separated to a first mask and a second mask of a double patterning mask set;
determining a maximum shift between the first and the second masks, wherein the maximum shift is a maximum expected mask shift in a manufacturing process for implementing the layout on a wafer; and
for each of the plurality of double patterning decompositions, simulating a worst-case performance value, wherein the step of simulating is performed using mask shifts within a range defined by the maximum shift, and wherein the step of simulating comprises:
calculating a capacitance of patterns from a spacing between the patterns, wherein the step of calculating is performed using a high-order equation or a piecewise equation, and wherein the high-order equation represents capacitances of the patterns as a high-order function of the spacings, and wherein the piecewise equation represents the capacitances as a piecewise function of the spacings.

2. The method of claim 1 further comprising:
comparing the worst-case performance values of the plurality of double patterning decompositions;
selecting a decomposition from the plurality of double patterning decompositions, wherein the worst-case performance value of the decomposition is the best among the worst-case performance values of the plurality of double patterning decompositions; and
using the decomposition to perform double patterning lithography steps on wafers.

3. The method of claim 1 further comprising:
generating a techfile comprising:
the capacitances of patterns in the layout as a function of spacings between the patterns; and
capacitance sensitivities of the capacitances to changes in the spacings, wherein the techfile is used in the step of simulating the worst-case performance value of the each of the plurality of double patterning decompositions.

4. The method of claim 3 further comprising:
retrieving an initial capacitance from the techfile;
performing the step of calculating the capacitance to generate a new capacitance from the initial capacitance and one of the mask shifts; and
using the new capacitance to calculate a performance value of the integrated circuit design, with the performance value corresponding to the one of the mask shifts.

5. The method of claim 1, wherein the step of calculating the capacitance is performed using the high-order equation having an order equal to or greater than two.

6. The method of claim 5 further comprising:
retrieving characterizing parameters of the high-order equation from a techfile; and
performing the step of calculating the capacitance using the characterizing parameters of the high-order equation retrieved from the techfile.

7. The method of claim 1, wherein the step of calculating the capacitance is performed using the piecewise equation.

8. A method comprising:
retrieving a layout of an integrated circuit design from a non-transitory computer-readable storage medium;
generating a plurality of double patterning decompositions from the layout, with each of the plurality of double patterning decompositions comprising patterns separated to a first mask and a second mask of a double patterning mask set;
determining capacitances of patterns in the layout as a function of spacings between the patterns, wherein the function is represented by a high-order equation having an order equal to or greater than two;
determining a maximum shift between the first and the second masks, wherein the maximum shift is a maximum expected shift in a manufacturing process for implementing the layout on a silicon wafer;
calculating a new capacitance of the patterns using the maximum shift and the high-order equation;
for each of the plurality of double patterning decompositions, using the new capacitance to calculate a performance value;
comparing the performance values of the plurality of double patterning decompositions to select one of the plurality of double patterning decompositions, with the performance value of the one of the plurality of double patterning decompositions being the best among all of the plurality of double patterning decompositions; and
manufacturing a double patterning mask set using the one of the plurality of double patterning decompositions.

9. The method of claim 8, wherein the high-order equation is expressed as:

$$C_c = C_{c0} + \sum_{i=1}^{N} a_i * (S - S0)^i$$

Wherein $C_c$ represents a capacitance value corresponding to spacing S, $C_{c0}$ represents a reference capacitance corresponding to reference spacing S0, and N represents the order of the high-order equation.

10. The method of claim 9 further comprising retrieving parameters $C_{c0}$, $a_i$, and S0 from a techfile.

11. The method of claim 10 further comprising storing the parameters $C_{c0}$, $a_i$, and S0 into the techfile.

12. The method of claim 9, wherein the order N is greater than two.

13. The method of claim 8 further comprising:
generating a plurality of possible mask shifts, with the plurality of possible mask shifts being in a range defined by the maximum shift;
calculating additional new capacitances of the patterns using the plurality of possible mask shifts and the high-order equation;
using the additional new capacitances to calculate additional performance values;
comparing the additional performance values and the performance value to determine a worst-case performance value for a respective decomposition, wherein the worst-case performance value is the worst among the additional performance values and the performance value; and
performing the step of selecting the one of the plurality of double patterning decompositions, wherein the worst-case performance value of the one of the plurality of double patterning decompositions is the best among the plurality of double patterning decompositions.

14. A method comprising:
retrieving a layout of an integrated circuit design from a non-transitory computer-readable storage medium;
generating a plurality of double patterning decompositions from the layout, with each of the plurality of double patterning decompositions comprising patterns separated to a first mask and a second mask of a double patterning mask set;
determining capacitances of patterns in the layout as a function of spacings between the patterns, wherein the function is represented as a piecewise equation, with the spacings segmented into at least three segments;
determining a maximum shift between the first and the second masks, wherein the maximum shift is a maximum expected shift in a manufacturing process for implementing the layout on a silicon wafer;
calculating a new capacitance of the patterns using the maximum shift and the piecewise equation;
for each of the plurality of double patterning decompositions, using the new capacitance to calculate a performance value; and
comparing the performance values of the plurality of double patterning decompositions to select one of the plurality of double patterning decompositions, with the performance value of the one of the plurality of double patterning decompositions being the best among all of the plurality of double patterning decompositions.

15. The method of claim 14, wherein the piecewise equation is expressed as:

$$C_c = C_{c0} + \sum_{i=1}^{J-1} b_i * (Si - S(i-1)) + b_J * (Si - S(J-1))$$

Wherein $C_c$ represents a capacitance value corresponding to spacing S of two neighboring patterns, $C_{c0}$ represents a reference capacitance corresponding to initial spacing S0, (J−1) represents a number of whole segments between spacings S0 and S, $b_i$ and $b_j$ represents capacitance sensitivities, and Si, S(i−1), and S(J−1) are dividing points of neighboring segments.

16. The method of claim 15 further comprising retrieving values $C_{c0}$, $b_i$, $b_j$, Si, S(i−1), and S(J−1) from a techfile.

17. The method of claim 16 further comprising storing parameters $C_{c0}$, $b_i$, $b_j$, Si, S(i−1), and S(J−1) into the techfile.

18. The method of claim 15, wherein the spacings are segmented into at least four segments.

19. The method of claim 14 further comprising:
generating a plurality of possible mask shifts, with the plurality of possible mask shifts being in a range defined by the maximum shift;
calculating additional new capacitances of the patterns using the plurality of possible mask shifts and the piecewise equation;
using the additional new capacitances to calculate additional performance values;
comparing the additional performance values and the performance value to determine a worst-case performance value for a respective decomposition, wherein the worst-case performance value is the worst among the additional performance values and the performance value; and
performing the step of selecting the one of the plurality of double patterning decompositions, wherein the worst-case performance value of the one of the plurality of double patterning decompositions is the best among the plurality of double patterning decompositions.

20. The method of claim 14 further comprising manufacturing a double pattering mask set using the one of the plurality of double patterning decompositions.

* * * * *